United States Patent
Ejima et al.

(10) Patent No.: US 8,958,505 B2
(45) Date of Patent: Feb. 17, 2015

(54) COMMUNICATION APPARATUS

(71) Applicant: Hitachi Kokusai Electric Inc., Tokyo (JP)

(72) Inventors: Satoru Ejima, Tokyo (JP); Takehiko Kobayashi, Tokyo (JP); Keat Beng Toh, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/951,739

(22) Filed: Jul. 26, 2013

(65) Prior Publication Data

US 2013/0315352 A1    Nov. 28, 2013

Related U.S. Application Data

(63) Continuation-in-part of application No. PCT/JP2011/068764, filed on Aug. 19, 2011.

(30) Foreign Application Priority Data

Mar. 18, 2011   (JP) ................. 2011-060821

(51) Int. Cl.
  *H04L 27/06*  (2006.01)
  *H04L 1/00*   (2006.01)
  (Continued)

(52) U.S. Cl.
  CPC ............ *H04L 1/0054* (2013.01); *H03M 13/25* (2013.01); *H03M 13/251* (2013.01); *H03M 13/2957* (2013.01)
  USPC ............................ 375/341; 375/262; 375/340

(58) Field of Classification Search
  USPC .......................................................... 375/341
  See application file for complete search history.

(56) References Cited

U.S. PATENT DOCUMENTS

| | | | |
|---|---|---|---|
| 2002/0174376 A1* | 11/2002 | Classon et al. ..................... | 714/4 |
| 2004/0153956 A1* | 8/2004 | Yu et al. ......................... | 714/795 |
| 2005/0031053 A1 | 2/2005 | Claussen et al. | |

(Continued)

FOREIGN PATENT DOCUMENTS

| | | |
|---|---|---|
| JP | 2005-65271 A | 3/2005 |
| JP | 2005-519532 A | 6/2005 |

(Continued)

OTHER PUBLICATIONS

International Search Report.

(Continued)

*Primary Examiner* — Erin File
(74) *Attorney, Agent, or Firm* — Bacon & Thomas, PLLC

(57) ABSTRACT

The present invention is directed to reduction of operation amount of likelihood calculation (LLR calculation) in a communication apparatus for performing communications using an extended mapping in which a plurality of bit sequences are assigned to a single symbol point. A receiving unit receives a signal which is transmitted from a transmitting unit by using the extended mapping. A repetition process unit decodes the received signal from the receiving unit by calculating an LLR of the received signal and performing a repetition process. In this case, the LLR is calculated for every bit using a MAX-LOG approximation and a thus-derived approximation formula is multiplied by weighting factors corresponding to proportions of "0" and "1" in each bit assigned to a symbol point closest to the received signal.

5 Claims, 3 Drawing Sheets

(51) Int. Cl.
*H03M 13/25* (2006.01)
*H03M 13/29* (2006.01)

(56) References Cited

U.S. PATENT DOCUMENTS

| | | | |
|---|---|---|---|
| 2005/0201484 A1 | 9/2005 | Wilhelmsson et al. | |
| 2007/0229329 A1* | 10/2007 | Maru | 341/94 |
| 2009/0125793 A1* | 5/2009 | Kishigami et al. | 714/794 |
| 2009/0245432 A1 | 10/2009 | Matsumoto et al. | |
| 2010/0146365 A1 | 6/2010 | Yano et al. | |
| 2011/0051858 A1* | 3/2011 | Salvekar et al. | 375/341 |
| 2013/0215955 A1* | 8/2013 | Siti et al. | 375/233 |

FOREIGN PATENT DOCUMENTS

| | | |
|---|---|---|
| JP | 2009-239377 A | 10/2009 |
| JP | 2010-130397 A | 6/2010 |

OTHER PUBLICATIONS

Irregular Repetition and Single Parity Check Coded BICM-ID Using Extended Mapping-Optimal Node Degree Allocation, Kisho Fukawa et al., CHINACOM 2010, Aug. 25-27, Beijing, China.

Extended Mappings for BIT-Interleaved Coded Modulation, Patrick Henkel, The 17th Annual IEEE International Symposium on Personal, Indoor and Mobile Radio Communications (PIMRC'06).

* cited by examiner

COMMUNICATION APPARATUS

This application is a Continuation-in-Part Application of PCT International Application No. PCT/JP2011/068764 filed on 19 Aug., 2011, which designated the United States.

FIELD OF THE INVENTION

The present invention relates to a communication apparatus; and, more particularly, to a communication apparatus capable of reducing the operation amount of likelihood calculation in a communication using an extended mapping in which a plurality of bit sequences are assigned to a single symbol point.

BACKGROUND OF THE INVENTION

Background technology will be described with reference to FIGS. 1 and 2. The details of the background technology are disclosed in Non-Patent Document 1.

FIG. 1 depicts an example of a configuration of a communication apparatus using BICM-ID (Bit-Interleaved Coded Modulation with Iterative Decoding) using an extended mapping, which shows configurations of a transmitting unit and a receiving unit.

The communication apparatus may be, e.g., a transmitter having only a function of the transmitting unit or a receiver having only a function of the receiving unit or a transceiver having both functions of the transmitting unit and the receiving unit.

The transmitting unit includes an encoder 1, an interleaver 2, a mapper 3, a D/A (digital to analog) converter 4, a transmission RF (radio frequency) section 5, and a transmission antenna 6.

The receiving unit includes a reception antenna 11, a reception RF section 12, an A/D (analog to digital) converter 13, a demapper 14, a deinterleaver 15, a decoder 16, and an interleaver 17.

FIG. 2 shows an example of the extended mapping, wherein the extended mapping is performed on a 5-bit sequence B ($b_0$, $b_1$, $b_2$, $b_3$, $b_4$) in QPSK (Quadrature Phase Shift Keying).

In the present example, among four symbols in an I-Q plane, a symbol $S_0$ is assigned with bit sequences $B_0$~$B_7$ (10011, 10110, 01011, 10101, 01110, 01101, 11111, 00111); a symbol $S_1$ is assigned with bit sequences $B_8$~$B_{15}$ (00100, 00001, 00010, 11010, 11001, 10000, 01000, 11100); a symbol $S_2$ is assigned with bit sequences $B_{16}$~$B_{23}$ (10111, 01111, 00110, 11101, 00101, 00011, 11110, 11011); and a symbol $S_3$ is assigned with bit sequences $B_{24}$~$B_{31}$ (10010, 00000, 11000, 10001, 01010, 10100, 01001, 01100).

Hereinafter, the details regarding a problem in the background technology will be mainly described.

In the transmitting unit, a transmission bit is inputted to the encoder 1 and the encoder 1 carries out encoding (e.g., turbo coding) of the transmission bit. The encoded signal is inputted to the mapper 3 via the interleaver 2, and the mapper 3 carries out a mapping process. Here, as a method of mapping, an extended mapping is used to assign a plurality of bit sequences to a single symbol point, of which example is shown in FIG. 2. The signal mapped by the mapper 3 is converted from a digital signal to an analog signal by the D/A converter 4. The converted signal is transmitted by radio to the transmission antenna 6 via the transmission RF section 5 for the transmission process.

In the receiving unit, a signal received from the reception antenna 11 (the signal transmitted from the transmitting unit) is converted to a base band signal by the reception RF section 12 and the base band signal is inputted to the A/D converter 13. This signal is converted from an analog signal to a digital signal by the A/D converter 13 and the converted signal is inputted to the demapper 14. The demapper 14 calculates a log likelihood ratio (LLR) of every bit, based on a received signal (the signal from the A/D converter 13), a noise power included in the received signal, and advance information obtained through the interleaver 17 from decoder 16. This calculation will be later described in detail.

The LLR, calculated by the demapper 14, is inputted to the decoder 16 via the deinterleaver 15. The decoder 16 carries out decoding based on the inputted LLR, thereby calculating a second LLR. The second LLR calculated by the decoder 16 is inputted (fed back) to the demapper 14 via the interleaver 17 and the demapper 14, again, calculates the LLR based on the received signal, the noise power, and the advance information which is fed back.

By iteratively performing the above process, a good decoding result can be satisfactorily acquired. The advance information which is fed back is assumed as zero in a first iteration (in a first operation of the demapper 14).

The LLR calculation by the demapper 14 will be described now.

When a N-bit (N is an integer equal to or more than 1 or 2) sequence B ($b_0$, $b_1$, ..., $b_{N-1}$) is assigned to M (M is an integer equal to or more than 1 or 2) number of symbol points $S_k$, the LLR outputted from the demapper 14 is considered.

Eq. (1) is established when the received signal is y, i-th (i=0, 1, ..., N−1) bit is $b_i$, and the LLR for $b_i$ is $L(b_i)$:

$$L(b_i) = \log\frac{p(b_i=0|y)}{p(b_i=1|y)}$$

$$= \log\frac{p(y|b_i=0)p(b_i=0)/p(y)}{p(y|b_i=1)p(b_i=1)/p(y)}$$

$$= \log\frac{p(y|b_i=0)}{p(y|b_i=1)} + \log\frac{p(b_i=0)}{p(b_i=1)}. \quad \text{Eq. (1)}$$

As will be later described, a first term in the last right-hand side of Eq. (1) is the LLR obtained from the other bits except the i-th bit, which is referred to as external information, $L_e(b_i)$. A second term in the last right-hand side of Eq. (1) is the LLR obtained from a prior probability of the i-th bit, which is referred to as $L_a(b_i)$.

By doing so, Eq. (1) becomes Eq. (2) and is transformed to Eq. (3):

$$L(b_i)=L_e(b_i)+L_a(b_i) \quad \text{Eq. (2)}$$

and $$L_e(b_i)=L(b_i)-L_a(b_i). \quad \text{Eq. (3)}$$

The demapper 14 outputs the LLR which is a result of Eq. (3).

Herein, a numerator $p(y|b_i=0)$ in the first term in the last right-hand side of Eq. (1) is considered.

The $p(y|b_i=0)$ is a probability of the received signal becoming y when given $b_i=0$. The $p(y|b_i=0)$ is expressed as $p(y|B_n)$ $p(B_n|b_i=0)$, wherein the $p(y|B_n)$ is a probability of becoming y when given $B_n$, and the $p(B_n|b_i=0)$ is a probability of becoming a bit sequence $B_n$ when given $b_i=0$. As all bit sequences $B_n$ are considered, Eq. (4) is established:

$$p(y \mid b_i = 0) = \sum_{B_n \mid b_i(B_n)=0} p(y \mid B_n) p(B_n \mid b_i = 0), \quad \text{Eq. (4)}$$

wherein $b_i(B_n)$ represents $i^{th}$ bit of the bit sequence $B_n$.

Similarly, Eq. (5) is established with respect to a denominator $p(y|b_i=1)$ in the first term in the last right-hand side of Eq. (1):

$$p(y \mid b_i = 1) = \sum_{B_n \mid b_i(B_n)=1} p(y \mid B_n) p(B_n \mid b_i = 1). \quad \text{Eq. (5)}$$

Accordingly, the first term in the last right-hand side of Eq. (1) becomes Eq. (6):

$$L_e(b_i) = \log \frac{p(y \mid b_i = 0)}{p(y \mid b_i = 1)} \quad \text{Eq. (6)}$$
$$= \log \frac{\sum_{B_n \mid b_i(B_n)=0} p(y \mid B_n) p(B_n \mid b_i = 0)}{\sum_{B_n \mid b_i(B_n)=1} p(y \mid B_n) p(B_n \mid b_i = 1)}.$$

Regarding the $p(y|B_n)$ in Eq. (6), considering that Gaussian noises of variances $\sigma_I^2$ and $\sigma_Q^2$ are added to I and Q, respectively in the process of transferring the bit sequence $B_n$ and going on to the received signal y, Eq. (7) is derived:

$$p(y \mid B_n) = \quad \text{Eq. (7)}$$
$$\frac{1}{\sqrt{2\pi\sigma_I^2}} \exp\left(-\frac{(\text{Re}(y - B_n))^2}{2\sigma_I^2}\right) \frac{1}{\sqrt{2\pi\sigma_Q^2}} \exp\left(-\frac{(\text{Im}(y - B_n))^2}{2\sigma_Q^2}\right),$$

wherein the notation "$y-B_n$" means positional difference between y and $B_n$ (to be precise, $S_k$ assigned with $B_n$) in mapping space, as shown in FIG. 2.

Further, Eq. (8) is derived when $\sigma_I^2 = \sigma_Q^2$ and $\sigma_I^2 + \sigma_Q^2 = 2\sigma_I^2 = 2\sigma_Q^2 = \sigma^2$:

$$p(y \mid B_n) = \frac{1}{\pi\sigma^2} \exp\left(-\frac{|y - B_n|^2}{\sigma^2}\right). \quad \text{Eq. (8)}$$

The $p(B_n|b_i=0)$ in Eq. (6) is a probability of becoming a bit sequence $B_n$ when given $b_i=0$ and it is expressed as a product of prior probabilities of the other bits except $b_i$ among the bits composing the bit sequence $B_n$. When j-th (j=0, 1, ..., N−1) bit of the bit sequence $B_n$ is $b_j(B_n)$, Eq. (9) is established:

$$b_j(B_n) \in \{0, 1\}, \quad \text{Eq. (9)}$$
$$p(B_n \mid b_i = 0) = \prod_{j \neq i} p(b_j = b_j(B_n)).$$

Here, $p(b_j=b_j(B_n))$ is considered.

When $L_a(b_j)$ is applied as prior information, the second term in the last right-hand side of Eq. (1) is changed to Eq. (10) and further to Eq. (11):

$$L_a(b_j) = \log \frac{p(b_j = 0)}{p(b_j = 1)} \quad \text{Eq. (10)}$$

and $$\frac{p(b_j = 0)}{p(b_j = 1)} = \exp(L_a(b_j)). \quad \text{Eq. (11)}$$

Furthermore, Eqs. (12) and (13) are established based on the relation of $p(b_j=0)+p(b_j=1)=1$:

$$p(b_j = 0) = \frac{\exp(L_a(b_j))}{1 + \exp(L_a(b_j))} \quad \text{Eq. (12)}$$

and $$p(b_j = 1) = \frac{1}{1 + \exp(L_a(b_j))}. \quad \text{Eq. (13)}$$

Eq. (14) is derived by using these Eqs. (12) and (13), and Eq. (9) becomes Eq. (15):

$$p(b_j = b_j(B_n)) = \frac{\exp(-b_j(B_n)L_a(b_j))}{1 + \exp(-L_a(b_j))} \quad \text{Eq. (14)}$$

and $$p(B_n \mid b_i = 0) = \prod_{j \neq i} p(b_j = b_j(B_n)) \quad \text{Eq. (15)}$$
$$= \prod_{j \neq i} \frac{\exp(-b_j(B_n)L_a(b_j))}{1 + \exp(-L_a(b_j))}.$$

Similar to Eq. (15), another equation for $p(B_n|b_i=1)$ is also established.

Finally Eq. (16a) is obtained from Eqs. (6), (8), (15) and the other equation for $p(B_n|b_i=1)$, where the summation ($\Sigma$) in the numerator is adopted among $b_j(B_b)$ of 0, and the summation in the denominator is adopted among $b_j(B_n)$ of 1:

$$L_e(b_i) = \log \frac{p(y \mid b_i = 0)}{p(y \mid b_i = 1)} \quad \text{Eq. (16a)}$$
$$= \log \frac{\sum_{B_n \mid b_i(B_n)=0} \frac{1}{\pi\sigma^2} \exp\left(-\frac{|y - B_n|^2}{\sigma^2}\right) \prod_{j \neq i} \frac{\exp(-b_j(B_n)L_a(b_j))}{1 + \exp(-L_a(b_j))}}{\sum_{B_n \mid b_i(B_n)=1} \frac{1}{\pi\sigma^2} \exp\left(-\frac{|y - B_n|^2}{\sigma^2}\right) \prod_{j \neq i} \frac{\exp(-b_j(B_n)L_a(b_j))}{1 + \exp(-L_a(b_j))}}$$

-continued $$= \log \frac{\sum_{B_n | b_i(B_n)=0} \exp\left(-\frac{|y-B_n|^2}{\sigma^2}\right) \prod_{j \neq i} \exp(-b_j(B_n)L_a(b_j))}{\sum_{B_n | b_i(B_n)=1} \exp\left(-\frac{|y-B_n|^2}{\sigma^2}\right) \prod_{j \neq i} \exp(-b_j(B_n)L_a(b_j))}$$

$$= \log \frac{\sum_{B_n | b_i(B_n)=0} \exp\left(-\frac{|y-B_n|^2}{\sigma^2}\right) \prod_{j} \exp(-b_j(B_n)L_a(b_j))/\exp(-b_i(B_n)L_a(b_i))}{\sum_{B_n | b_i(B_n)=1} \exp\left(-\frac{|y-B_n|^2}{\sigma^2}\right) \prod_{j} \exp(-b_j(B_n)L_a(b_j))/\exp(-b_i(B_n)L_a(b_i))}$$

$$= \log \frac{\sum_{B_n | b_i(B_n)=0} \exp\left(-\frac{|y-B_n|^2}{\sigma^2}\right) \prod_{j} \exp(-b_j(B_n)L_a(b_j))}{\sum_{B_n | b_i(B_n)=1} \exp\left(-\frac{|y-B_n|^2}{\sigma^2}\right) \prod_{j} \exp(-b_j(B_n)L_a(b_j))}.$$

When the number of iteration is 1 (first iteration), Eq. (16a) should be replaced by Eq. (16b):

$$L_e(b_i) = \log \frac{p(y|b_i=0)}{p(y|b_i=1)} \qquad \text{Eq. (16b)}$$

$$= \log \frac{\sum_{B_n | b_i(B_n)=0} \exp\left(-\frac{|y-B_n|^2}{\sigma^2}\right)}{\sum_{B_n | b_i(B_n)=1} \exp\left(-\frac{|y-B_n|^2}{\sigma^2}\right)}.$$

From the above, the demapper 14 performs an exponential operation and calculates a sum total for not only bit sequences but also every bit assigned to each of the bit sequences. Further, the demapper 14 derives the denominator and the numerator from the results and performs logarithmic calculations of them.

However, in executing the repetition process in BICM-ID, in order to calculate the LLR, the demapper 14 needs to perform the exponential operation and the log operation for each bit of each bit sequence. Accordingly, the operation amount becomes enormously large.

To reduce the operation amount, a MAX-LOG approximation such as Eq. (17) is used:

$$\log\left(\sum_{j=1}^{k} \exp(a_j)\right) \equiv \max(a_1, a_2, a_3, \ldots, a_k). \qquad \text{Eq. (17)}$$

Using Eq. (17), Eq. (16b) is simplified into:

$$L_e(b_i) = \log \frac{\sum_{B_n | b_i(B_n)=0} \exp\left(-\frac{|y-B_n|^2}{\sigma^2}\right)}{\sum_{B_n | b_i(B_n)=1} \exp\left(-\frac{|y-B_n|^2}{\sigma^2}\right)} \qquad \text{Eq. (18)}$$

$$\approx \max_{B_n | b_i(B_n)=0}\left(-\frac{|y-B_n|^2}{\sigma^2}\right) - \max_{B_n | b_i(B_n)=1}\left(-\frac{|y-B_n|^2}{\sigma^2}\right).$$

However, in the extended mapping shown in FIG. 2, bit sequences giving maximum value in the respective first and second term in the last right-hand side of Eq. (18) are equal because such bit sequences belong to the same symbol, so that the LLR becomes zero. Therefore, the LLR outputted from the demapper 14 becomes zero for any bit. For this reason, the decoder 16 cannot obtain the prior information and the LLR is not changed and stays zero even when the processing is repeated many times.

RELATED PRIOR ARTS

Patent Document 1: Japanese Patent Application Publication No. 2005-065271.
Patent Document 2: Japanese Patent Application Publication No. 2005-519532.
Non-Patent Document 1: P. Henkel, "Extended mapping for Bit-Interleaved coded Modulation", IEEE PIMRC, 2006, PP. 1-4.

SUMMARY OF THE INVENTION

In view of the above, the present invention provides a communication apparatus which can avoid the LLR from remaining zero and also reduce the operation amount of likelihood calculation in a communication using an extended mapping.

In order to achieve the above object, in the present invention, the communication apparatus (including a receiving side), which performs communications using the extended mapping in which a plurality of bit sequences are assigned to a single symbol point, has a following configuration.

A receiving unit receives a signal which is transmitted from a transmitting unit (e.g., a communication apparatus including a transmitting side), by using the extended mapping.

A repetition process unit decodes the received signal from the receiving unit by calculating an LLR of the received signal and performing a repetition process, wherein the LLR is calculated for every bit using a MAX-LOG approximation and a thus-derived approximation formula is multiplied by weighting factors proportional to the number of "0" and "1" bit assigned to a symbol point closest to the received signal.

In other words, the repetition process unit calculates a LLR based on enumerations of maximal probability on each of "0" and "1" bit.

As a configuration example, the communication apparatus in accordance with the present invention may have a following configuration.

The repetition process unit includes a demapper, a deinterleaver, a decoder, and an interleaver.

The demapper calculates an LLR.

As described above, in the communication apparatus in accordance with the present invention, the operation amount of likelihood calculation (LLR calculation) can be reduced in the communication using the extended mapping.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings which form a part hereof.

A communication apparatus will be described with reference to FIGS. 2 and 3 in accordance with an embodiment of the present invention.

Figure 1:
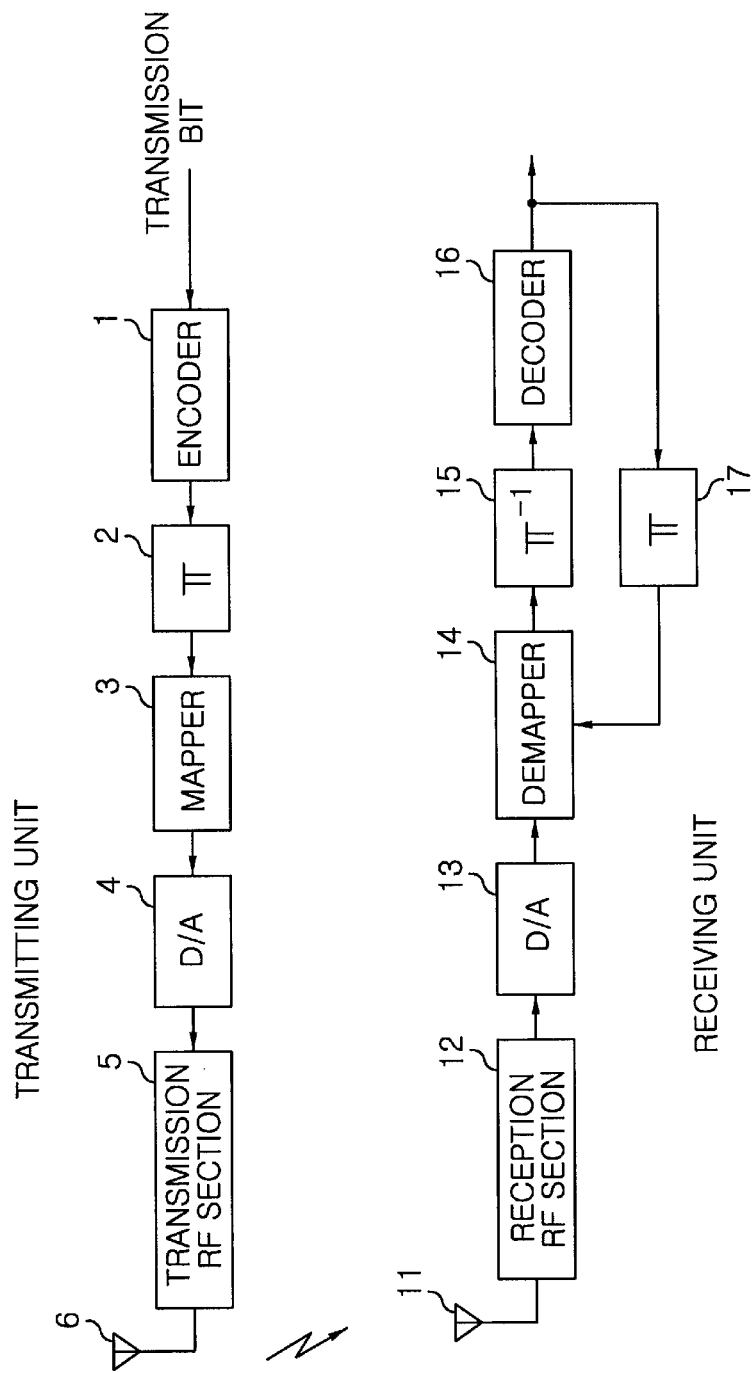
FIG. 1 is a view showing a configuration example of a conventional communication apparatus using BICM-ID using an extended mapping.
Figure 3:
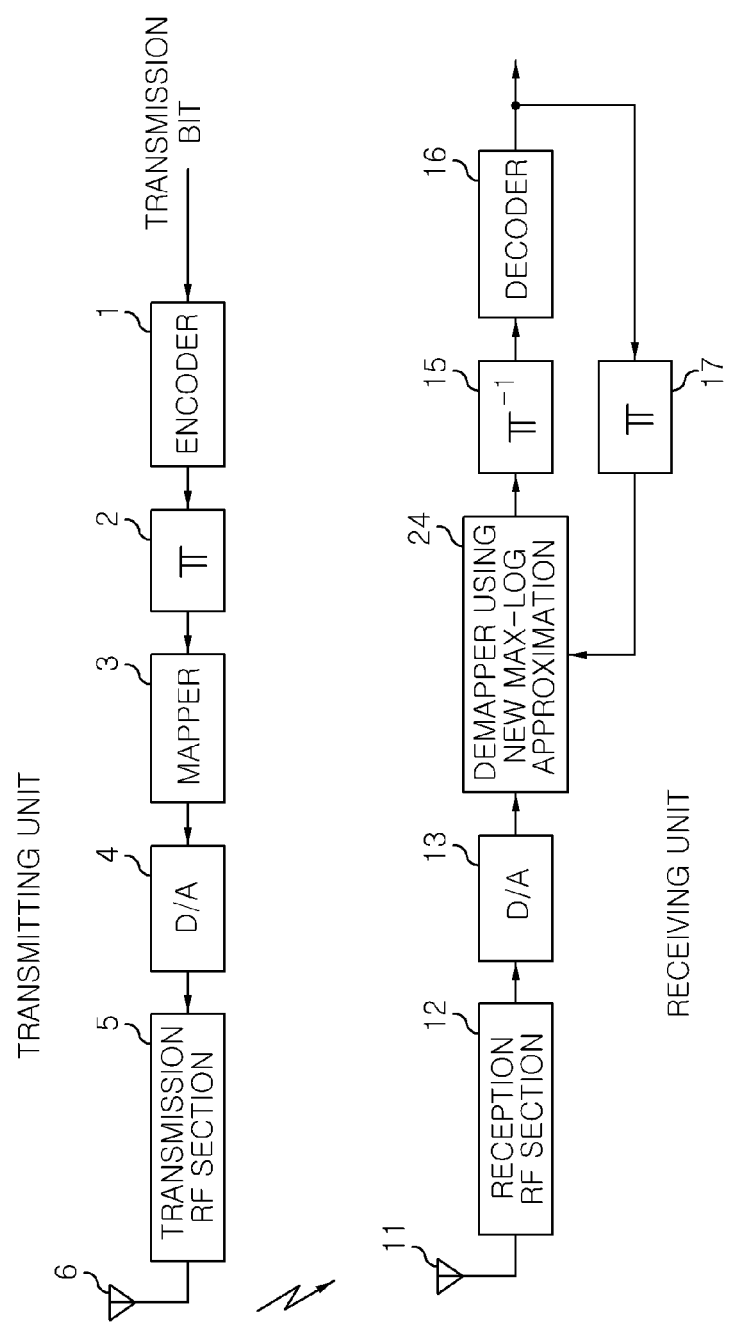
FIG. 3 is a view showing a configuration example of a communication apparatus employing a demapping using a MAX-LOG approximation in accordance with an embodiment of the present invention.

FIG. 3 depicts an example of a configuration of a communication apparatus employing a demapping using a MAX-LOG approximation in accordance with an embodiment of the present invention. In regards to a configuration and an operation of the communication apparatus of FIG. 3, a transmitting unit in the communication apparatus of FIG. 3 is similar to the one shown in FIG. 1 which was referred to in the description of the background. In addition, a receiving unit in the communication apparatus of FIG. 3, excluding a demapper using new MAX-LOG approximation 24, is similar to the one shown in FIG. 1, which was referred to in the description of the background.

Figure 2:
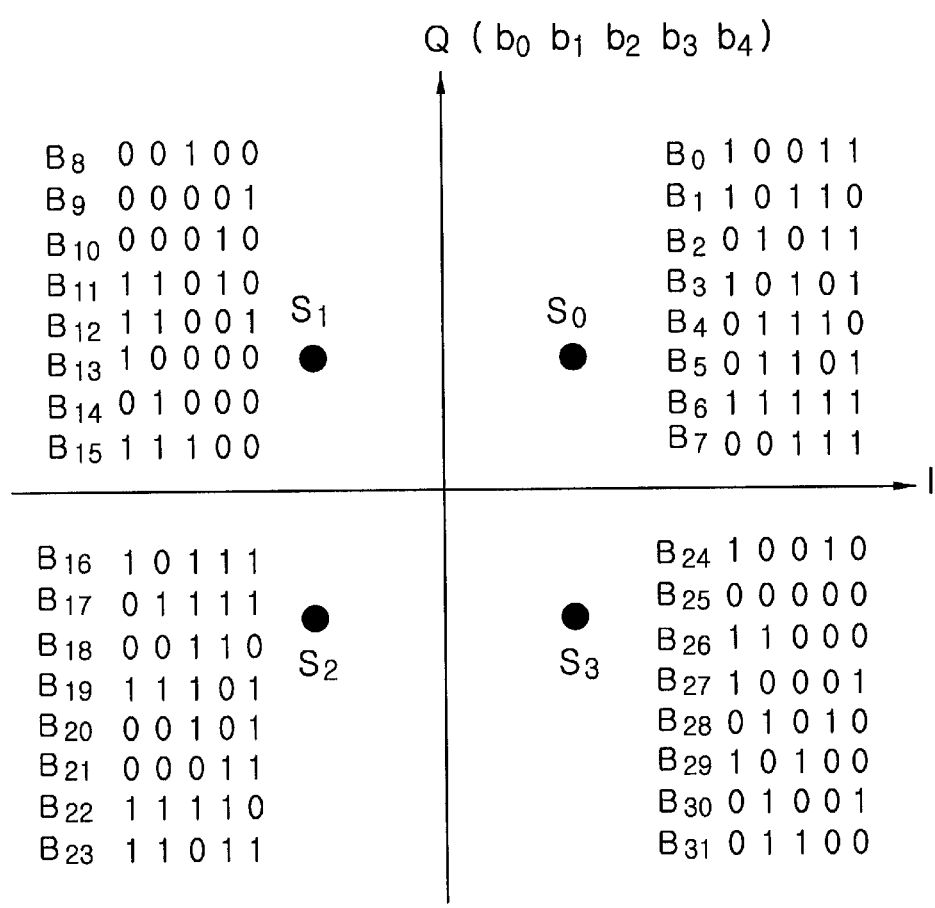
FIG. 2 is a view showing an example of the extended mapping.

FIG. 2 shows an example of an extended mapping.

For convenience of explanation, the present embodiment is described with reference to FIG. 2, which was referred to in the description of the background. However, there is no intention to unnecessarily limit the present embodiment.

Distinguishing features of the present embodiment will be described.

The demapper 24 in the present embodiment uses a new MAX-LOG approximation with weighting based on enumerations of maximal values instead of a conventional approximation based on only one maximal value for each of "0" and "1" bit as shown in Eq. (18).

For example, supposing that a received signal is the nearest to a symbol point $S_0$ as shown in FIG. 2 in the initial state of iterative calculation of LLR for the bit $b_2$, the number of bit sequences having "0" in $b_2$ and coming into maximal value(s) in the first term of Eq. (18) is 2 (i.e., $B_0$ and $B_2$) and the number of bit sequences having "1" in $b_2$ and coming into maximal value(s) in the second term of Eq. (18) is 6 (i.e., $B_1$, $B_3$, $B_4$, $B_5$, $B_6$, and $B_7$). Thus, Eq. (18) will be reformed as:

$$L_e(b_2) = \log \frac{\sum_{B_n|b_2(B_n)=0} \exp\left(-\frac{|y-B_n|^2}{\sigma^2}\right)}{\sum_{B_n|b_2(B_n)=1} \exp\left(-\frac{|y-B_n|^2}{\sigma^2}\right)} \quad \text{Eq. (19)}$$

$$\approx \log \frac{2 \times \exp\left(-\frac{|y-B_n|^2}{\sigma^2}\right)}{6 \times \exp\left(-\frac{|y-B_n|^2}{\sigma^2}\right)}$$

$$= \log 2 + \max_{B_n|b_i(B_n)=0}\left(-\frac{|y-B_n|^2}{\sigma^2}\right) - \log 6 - \max_{B_n|b_i(B_n)=1}\left(-\frac{|y-B_n|^2}{\sigma^2}\right)$$

$$= \log 2 - \log 6$$

$$\approx -1.0986.$$

Besides, another version of Eq. (19) may be obtained by just multiplying a first term and a second term in the last right-hand side of Eq. (18) by weighting factors $\alpha_0$ and $\alpha_1$, respectively, wherein the weighting factors $\alpha_0$ and $\alpha_1$ correspond to the number of "0" and "1" at a particular bit among bit sequences (e.g., $B_0$~$B_7$ for $S_0$) assigned to the most-probable symbol point (minimal distance to y):

$$L_e(b_i) \approx \alpha_0 \times \max_{S_k|b_i=0}\left(-\frac{|y-S_k|^2}{\sigma^2}\right) - \alpha_1 \times \max_{S_k|b_i=1}\left(-\frac{|y-S_k|^2}{\sigma^2}\right). \quad \text{Eq. (20)}$$

Accordingly, even if the MAX-LOG approximation is used at the initial state of the extended mapping, LLR can be produced, in so far as the number of "0" and "1" in a particular bit are different. Further, a repetition process is performed from this state, and ultimately, the LLR can be produced for all bits.

As described above, in a radio communication using the extended mapping in which a plurality of bit sequences are assigned to a single symbol point, the MAX-LOG approximation is used to calculate the LLR for every bit, and a thus-derived approximation formula is multiplied by weighting factors corresponding to the number of "0" and "1" at a particular bit among bit sequences assigned to a symbol point closest to the received signal. Accordingly, the operation amount is reduced.

Specifically, in the present embodiment, the weighting factors are respectively determined corresponding to the proportions of "0" and "1" in each bit assigned to the symbol point and the weighting factors are respectively multiplied to the first term and the second term in the last right-hand side of Eq. (18) which is related to the LLR calculation.

The new MAX-LOG approximation in the present embodiment is especially suitable but not limited to the initial state of LLR calculation. It may contribute to the reduction in the number of iterations and/or the whole amount of operation during the LLR calculation just by adopting Eq. (19) after the initial iteration.

Here, a configuration of a system or apparatus in accordance with the present invention is not limited to the above-described configuration but may use various configurations. Further, the present invention may be provided as a method or a means for performing a process concerning the present invention; or as a program for realizing the method or the means; or as a storage medium for storing the corresponding program. In addition, the present invention may be provided as a variety of systems or apparatuses.

Further, an application field of the present invention is not limited to those described above, but the present invention may be able to be applied to various fields.

Further, regarding various processes executed in the system or the apparatus, the present invention may be configured in such a way, e.g., that a processor in hardware resources, including the processor or a memory, executes a control program stored in a ROM (Read Only Memory), and, e.g., that each functional means for executing a corresponding process is embodied as an independent hardware circuit.

Further, the present invention may be understood by the control program itself or a computer-readable storage medium such as a floppy (registered trademark) disk or a CD-ROM which stores the control program. The process of the present invention may be performed by inputting the control program from the corresponding storage medium to a computer and executing the control program with the processor.

The present invention may be used for communication devices which performs communications using an extended mapping in which a plurality of bit sequences are ambiguously assigned to each of a plurality of symbol points, in a multilevel modulation in which the symbol points are arranged in a constellation. Further, the bit sequences are encoded to have a redundancy.

While the invention has been shown and described with respect to the embodiments, it will be understood by those skilled in the art that various changes and modifications may be made without departing from the scope of the invention as defined in the following claims.

What is claimed is:

1. A communication apparatus for performing communications using an extended mapping in which a plurality of bit sequences are assigned to a single symbol point, the communication apparatus comprising:
   a receiving unit configured to receive a signal which is transmitted from a transmitting unit using the extended mapping; and
   a repetition process unit configured to decode the received signal from the receiving unit by calculating a log likelihood ratio (LLR) of the received signal and performing a repetition process, wherein the LLR is calculated for every bit using a MAX-LOG approximation,
   wherein the repetition process unit, in an initial state of the repetition process for a particular bit, is configured to calculate a non-zero LLR as a function of the number of bit sequences assigned to a symbol point closest to the received signal and having "0" in the particular bit and the number of bit sequences assigned to the symbol point closest to the received signal and having "1" in the particular bit.

2. The communication apparatus of claim 1, wherein the repetition process unit includes a demapper, a deinterleaver, a decoder, and an interleaver, wherein the demapper calculates the LLR.

3. The communication apparatus of claim 1, wherein the non-zero LLR is a difference of a log of the number of bit sequences assigned to the symbol point closest to the received signal and having "0" in the particular bit and a log of the number of bit sequences assigned to the symbol point closest to the received signal and having "1" in the particular bit.

4. A method for performing communications using an extended mapping in which a plurality of bit sequences are assigned to a single symbol point by using a communication apparatus, the method comprising:
   receiving a signal which is transmitted from a transmitting unit using the extended mapping; and
   decoding the received signal by calculating a log likelihood ratio (LLR) of the received signal and performing a repetition process, wherein the LLR is calculated for every bit using a MAX-LOG approximation,
   wherein, in an initial state of the repetition process for a particular bit, a non-zero LLR is calculated as a function of the number of bit sequences assigned to a symbol point closest to the received signal and having "0" in the particular bit and the number of bit sequences assigned to the symbol point closest to the received signal and having "1" in the particular bit.

5. The method of claim 4, wherein the non-zero LLR is a difference of a log of the number of bit sequences assigned to the symbol point closest to the received signal and having "0" in the particular bit and a log of the number of bit sequences assigned to the symbol point closest to the received signal and having "1" in the particular bit.

* * * * *